United States Patent
She

(10) Patent No.: US 9,935,671 B2
(45) Date of Patent: Apr. 3, 2018

(54) COMPATIBLE CIRCUIT AND TERMINAL

(71) Applicant: XI'AN ZHONGXING NEW SOFTWARE CO. LTD., Xian, Shaanxi (CN)

(72) Inventor: Liang She, Shaanxi (CN)

(73) Assignee: XI'AN ZHONGXING NEW SOFTWARE CO. LTD., Xian, Shaanxi (CN)

( * ) Notice: Subject to any disclaimer, the term of this patent is extended or adjusted under 35 U.S.C. 154(b) by 0 days.

(21) Appl. No.: 15/313,175

(22) PCT Filed: Mar. 31, 2015

(86) PCT No.: PCT/CN2015/075461
§ 371 (c)(1),
(2) Date: Nov. 22, 2016

(87) PCT Pub. No.: WO2015/180526
PCT Pub. Date: Dec. 3, 2015

(65) Prior Publication Data
US 2017/0141808 A1 May 18, 2017

(30) Foreign Application Priority Data

May 27, 2014 (CN) .......................... 2014 1 0229067

(51) Int. Cl.
*H04B 1/40* (2015.01)
*H04W 88/02* (2009.01)

(52) U.S. Cl.
CPC .............. *H04B 1/40* (2013.01); *H04W 88/02* (2013.01)

(58) Field of Classification Search
USPC ..................... 455/73, 550.1, 552.1
See application file for complete search history.

(56) References Cited

U.S. PATENT DOCUMENTS 5,966,667 A * 10/1999 Halloran ............... H04W 88/06
455/552.1
6,038,132 A 3/2000 Tokunaga et al.
(Continued)

FOREIGN PATENT DOCUMENTS

CN 101150913 A 3/2008
CN 201563245 U 8/2010
(Continued)

OTHER PUBLICATIONS

International Search Report dated Jul. 1, 2015 issued in PCT/CN2015/075461.
(Continued)

*Primary Examiner* — Fayyaz Alam
(74) *Attorney, Agent, or Firm* — Scully Scott Murphy & Presser

(57) ABSTRACT

Disclosed are a compatible circuit and a terminal. The compatible circuit includes a printed circuit board (PCB) of which the existing structure is not changed, and a group of compatible devices which are in a pin-to-pin form and have different internal structures, wherein the compatible devices and the PCB are assembled together; the internal structures of the compatible devices are matched with a link compatibility selection requirement; and the compatible devices are configured to conduct link selection output on at least two links which are input and need compatibility, in accordance with the link compatibility selection requirement.

20 Claims, 8 Drawing Sheets

(56) References Cited

U.S. PATENT DOCUMENTS

| | | | |
|---|---|---|---|
| 6,216,252 B1 * | 4/2001 | Dangelo | G01R 31/31704 714/E11.167 |
| 6,385,756 B1 * | 5/2002 | Braun | H01L 23/50 257/666 |
| 2004/0266363 A1 * | 12/2004 | Richman | H04B 1/38 455/90.3 |
| 2011/0025435 A1 * | 2/2011 | Gorbachov | G06F 17/5036 333/245 |
| 2012/0041572 A1 * | 2/2012 | Halsall | H04L 12/40032 700/19 |
| 2013/0100623 A1 | 4/2013 | Lee et al. | |
| 2013/0120032 A1 * | 5/2013 | Quiquempoix | G06F 13/4282 327/142 |

FOREIGN PATENT DOCUMENTS

| | | |
|---|---|---|
| CN | 102520825 A | 6/2012 |
| CN | 102946316 A | 2/2013 |
| CN | 104092476 A | 10/2014 |
| DE | 10 2005 009 527 A1 | 9/2006 |
| EP | 2 023 498 A2 | 2/2009 |

OTHER PUBLICATIONS

Supplementary European Search Report issued in European Application No. EP 15 80 0431 dated May 8, 2017.

* cited by examiner

COMPATIBLE CIRCUIT AND TERMINAL

CROSS-REFERENCE TO RELATED APPLICATION

This application is the 371 application of PCT Application No. PCT/CN2015/075461, filed Mar. 31, 2015, which is based upon and claims priority to Chinese Patent Application No. 201410229067.2, filed May 27, 2014, the entire contents of which are incorporated herein by reference.

TECHNICAL FIELD

The present disclosure relates to a circuit technology, and particularly, to a compatible circuit and a terminal.

BACKGROUND

During the process of implementing the technical solutions of embodiments of the present disclosure, it is founded that at least the following technical problems exist in the related art.

Terminals, especially various mobile terminals such as a mobile phone, have become indispensable communication and entertainment tools in current life and work, and with the coming of the LIE 4G era, the mobile phone is developed towards multi-mode and multi-frequency band. According to the market requirements, double-mode, tri-mode, and even five-mode terminals are launched constantly, while a large number of GSM, CDMA, WCDMA TDD LTE, and FDD LTE, that support different systems of the mobile phone are also emerged, and frequency bands supported by one mobile phone have been even extended to about a dozen. However, application systems and frequency bands of each operator are different. To consider the aspects of aging and costs, it is usually needed to be compatible with different frequency bands and systems to satisfy the requirements of different operators while designing the terminals.

In the existing solution, a printed circuit board (PCB) is usually designed, and the PCB, which is used as a support of electronic components, is a carrier for electrical connection of the electronic components. In order to implement the electrical connection among the electronic components, the PCB needs to be used in almost every kind of electronic devices (as small as an electronic watch and a calculator, and as big as a computer and the terminals that we have discussed) as long as the electronic components include an integrated circuit.

However, the terminals are more and more smart, so that functional modules for implementing various smart functions, such as enlarging a battery and increasing quantity of antennas, are increased day by day. Because these terminal parts are all implemented on a PCB, the increasing of the terminal parts may occupy a currently limited layout space of the PCB step by step. To adapt to more smart requirements, it is nearly impossible to design all the terminal parts on one PCB, for example, when the terminal is a mobile phone, it is impossible to arrange all radio frequency links on the PCB. If the layout space of the PCB is increased to adapt to more smart requirements of the terminal, an additional cost may be increased since the design and manufacture of the PCB may directly affect the quality and cost of the whole terminal.

In conclusion, the problem in the related art is as follows: it is almost impossible to design all the terminal parts on one PCB; and if the layout space of the PCB is increased to adapt to more smart requirements of the terminal, an additional cost will be increased, which is not feasible either. For this problem, there is no effective solution at present.

This section provides background information related to the present disclosure which is not necessarily prior art.

SUMMARY

In light of this, the embodiments of the present disclosure are expected to provide a compatible circuit and a terminal, which can satisfy a layout requirement of more terminal parts for a smart terminal, and have compatibility, so that all the terminal parts are not necessary to be designed on one PCB, and an additional cost will not be increased.

The technical solutions of the embodiments of the present disclosure are implemented as follows.

The embodiments of the present disclosure provide a compatible circuit, including:

a printed circuit board PCB with an unchanged existing structure, and a group of compatible devices which are in a Pin-to-Pin form and have different internal structures, wherein the compatible devices and the PCB are assembled together;

the internal structures of the compatible devices are matched with a link compatibility selection requirement; and the compatible devices are configured to conduct a link selection output on at least two links which are inputted and need compatibility according to the link compatibility selection requirement.

In an embodiment, there are two links which are inputted and need compatibility, the two links are a first link and a second link respectively;

accordingly, one group of compatible devices includes two compatible devices, which are a first compatible device and a second compatible device respectively, wherein:

the first compatible device is configured to connect the inputted first link to a first Output end to output, and select the first link to be under a working state when the first compatible device and the PCB are assembled together; and the second compatible device is configured to connect the inputted second link to the first output end to output, and select the second link to be under a working state when the second compatible device and the PCB are assembled together.

In an embodiment, there are more than two links which are inputted and need compatibility are provided, the more than two links are a first link to an $N^{th}$ link respectively; and N is a natural number greater than 2;

accordingly, one group of compatible devices includes more than two compatible devices, which are a first compatible device to an $N^{th}$ compatible device respectively, wherein:

the first compatible device is configured to connect the inputted first link to a first output end to output, and select the first link to be under a working state when the first compatible device and the PCB are assembled together; and so on, until the $N^{th}$ compatible device is configured to connect the inputted $N^{th}$ link to the first output end to output, and select the $N^{th}$ link to be under a working state when the $N^{th}$ compatible device and the PCB are assembled together.

In an embodiment, there are N links which are inputted and need compatibility, the N links are a first link to an $N^{th}$ link respectively; and N is a natural number greater than or equal to 2;

accordingly, one group of compatible devices includes N compatible devices, which are a first compatible device to an $N^{th}$ compatible device; M output ends are provided, and M is a natural number greater than or equal to 2, wherein:

the first compatible device is configured to connect at least one link of the inputted first link to the $N^{th}$ link to a first output end to output, and select the at least one link of the inputted first link to the $N^{th}$ link which is connected to the first output end to be under a working state when the first compatible device and the PCB are assembled together;

the $N^{th}$ compatible device is configured to connect at least one link of the inputted first link to the $N^{th}$ link to at least one output end of the first output end to the $M^{th}$ output end to output, and select the at least one link of the inputted first link to the $N^{th}$ link which is connected with the at least one output end to be under a working state when the $N^{th}$ compatible device and the PCB are assembled together; and so on, until a compatibility selection of any link between N inputs and M outputs of any link is completed through the first compatible device to the $N^{th}$ compatible device.

In an embodiment, the output end is configured to connect to a public link, and the compatible devices are located at a front segment or a rear end of the public link.

In an embodiment, the internal structures of the compatible devices are formed by at least one manner of series resistors, capacitors, inductors and straight-through wires according to the link compatibility selection requirement.

In an embodiment, the compatible devices are also internally packed with at least one device of a differential duplexer, a single-ended duplexer, a differential filter and a single-ended filter.

In an embodiment, the compatible devices and the PCB are assembled together in a mounting manner.

Embodiments of the present disclosure provide a terminal including the compatible circuit, wherein:

the compatible circuit includes: a printed circuit board PCB with an unchanged existing structure, and a group of compatible devices which are in a Pin-to-Pin form and have different internal structures, the compatible devices and the PCB are assembled together;

the internal structures of the compatible devices are matched with a link compatibility selection requirement; and the compatible devices are configured to conduct a link selection output on at least two links which are inputted and need compatibility according to the link compatibility selection requirement.

In an embodiment, the compatible circuit is the compatible circuit according to any one of the foregoing solutions.

The compatible circuit according to the embodiments of the present disclosure includes a printed circuit board PCB with an unchanged existing structure, and a group of compatible devices which are in a Pin-to-Pin form and have different internal structures, wherein the compatible devices and the PCB are assembled together; the internal structures of the compatible devices are matched with a link compatibility selection requirement; and the compatible devices are configured to conduct link selection output on at least two links which are inputted and need compatibility according to the link compatibility selection requirement. Because the link selection output complied with the link compatibility selection requirement is implemented through a compatible device without changing the PCB, the embodiments of the present disclosure have compatibility, so that all the terminal parts are not necessary to be designed on one PCB, and an additional cost will not be increased.

This section provides a summary of various implementations or examples of the technology described in the disclosure, and is not a comprehensive disclosure of the full scope or all features of the disclosed technology.

DETAILED DESCRIPTION

The implementation of the technical solutions be further described in details with reference to the drawings hereinafter.

Figure 1A:
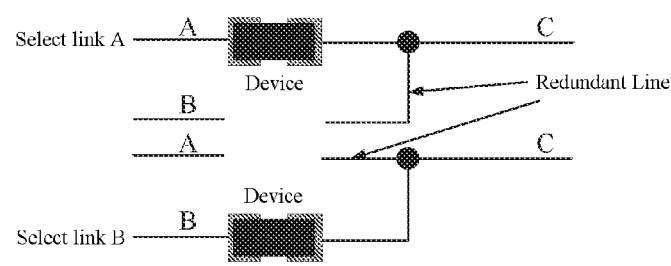
FIGS. 1a-1b are block diagram for selecting inputs and outputs of a compatible circuit by using the related art.
Figure 1B:
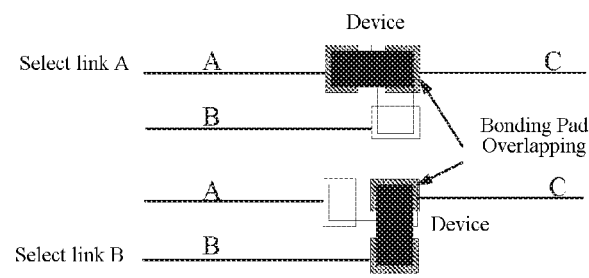

The embodiments of the present disclosure can satisfy a layout requirement of more terminal parts for a smart terminal, so that all the terminal parts are unnecessary to be designed on one PCB, and an additional cost will not be increased. Moreover, a compatible design idea is introduced in the circuit design of the terminal. The embodiments of the present disclosure are different from the existing circuit compatibility technology in the industry. The existing circuit compatibility technology is as shown in FIG. 1a to FIG. 1b. Because it is almost impossible to arrange all radio frequency links on a PCB, it is usually necessary to repeatedly utilize the radio frequency links and even baseband links in a limited space while designing frequency band compatibility. As shown in FIG. 1a, input and output selection effects of different links are achieved by mounting resistors and capacitors at different positions, wherein link A and link B refer to an input respectively, and link C refers to an output. However, in the method as shown in FIG. 1a, redundant lines exist, which influences a radio frequency index. As shown in FIG. 1b, the redundant lines are eliminated through overlapping bonding pads, however, this is a non-standard design, and the compatible frequency bands are limited.

The compatibility technology of the embodiments of the present disclosure does not change the existing PCB, and the existing PCB still implements the present basic functions, but a compatible device having a special structure is mounted on the existing PCB to achieve the compatible/multiplexing purpose of the circuit design. This function may be implemented by designing one compatible device corresponding to one type of special function. That is, with regard to different intelligent demands of the terminal, a link selection compatibility effect is implemented by a manner of adopting one existing PCB+any one of multiple compatible devices, thus satisfying the purpose of circuit design compatibility. Because it only needs to change the compatible devices and does not need to change the existing PCB, all the terminal parts are unnecessary to be designed on one PCB with the changes, and an additional cost will not be increased.

The embodiments of the present disclosure provide a compatible circuit, including:

a printed circuit board PCB with an unchanged existing structure, and a group of compatible devices which are in a Pin-to-Pin form and have different internal structures, wherein the compatible devices and the PCB are assembled together. The internal structures of the compatible devices are matched with a link compatibility selection requirement; and the compatible devices are configured to conduct link selection output on at least two links which are inputted and need compatibility according to the link compatibility selection requirement.

In a preferred implementation manner of the embodiments of the present disclosure, two links which are inputted and need compatibility are provided, which are a first link and a second link respectively.

Accordingly, one group of compatible devices includes two compatible devices, which are a first compatible device and a second compatible device respectively.

The first compatible device is configured to connect the inputted first link to a first output end to output, and select the first link to be under a working state when the first compatible device and the PCB are assembled together.

the second compatible device is configured to connect the inputted second link to the first output end to output, and select the second link to be under a working state when the second compatible device and the PCB are assembled together.

In the preferred implementation manner, a group of compatible devices formed by the first compatible device and the second compatible device can be adopted to implement a one-from-two solution for two-link compatibility selection.

In a preferred implementation manner of the embodiments of the present disclosure, more than two links which are inputted and need compatibility are provided, which are a first link to an $N^{th}$ link respectively; and N is a natural number greater than 2.

Accordingly, one group of compatible devices includes more than two compatible devices, which are a first compatible device to an $N^{th}$ compatible device respectively.

The first compatible device is configured to connect the inputted first link to a first output end to output, and select the first link to be under a working state when the first compatible device and the PCB are assembled together; and the similar process is performed, until the $N^{th}$ compatible device is configured to connect the inputted $N^{th}$ link to the first output end to output, and select the $N^{th}$ link to be under a working state when the $N^{th}$ compatible device and the PCB are assembled together.

In the preferred implementation manner, a group of compatible devices formed by the first compatible device to the $N^{th}$ compatible device can be adopted to implement a one-from-N compatible solution for N-link compatibility selection.

In a preferred implementation manner of the embodiments of the present disclosure, N links which are inputted and need compatibility are provided, which are a first link to an $N^{th}$ link respectively; and N is a natural number greater than or equal to 2.

Accordingly, one group of compatible devices includes N compatible devices, which are a first compatible device to an $N^{th}$ compatible device respectively; M output ends are provided, and M is a natural number greater than or equal to 2.

The first compatible device is configured to connect at least one link of the inputted first link to the $N^{th}$ link to the first output end to output, and select the at least one link of the inputted first link to the $N^{th}$ link which is connected to the first output end to be under a working state when the first compatible device and the PCB are assembled together;

the $N^{th}$ compatible device is configured to connect at least one link of the inputted first link to the $N^{th}$ link to at least one output end of the first output end to the $M^{th}$ output end to output, and select the at least one link of the inputted first link to the $N^{th}$ link which is connected with the output end to be under a working state when the $N^{th}$ compatible device and the PCB are assembled together; and the similar process is performed, until compatibility selection of any connection between N inputs and M outputs is completed through the first compatible device to the $N^{th}$ compatible device.

In the preferred embodiment, a group of compatible devices formed by the first compatible device to the $N^{th}$ compatible device can be adopted to implement an M-from-N compatible solution for N-link compatibility selection.

In a preferred implementation manner of the embodiments of the present disclosure, the output end is configured to connect to a public link, and the compatible devices are located at a front segment or a rear segment of the public link.

In a preferred implementation manner of the embodiments of the present disclosure, the internal structure of the compatible device is formed by at least one manner of series resistors, capacitors, inductors and straight-through wires according to the link compatibility selection requirement.

In a preferred implementation manner of the embodiments of the present disclosure, the compatible device is also internally packed with at least one device of a differential duplexer, a single-ended duplexer, a differential filter and a single-ended filter.

In a preferred implementation manner of the embodiments of the present disclosure, the compatible devices and the PCB are assembled together in a mounting manner.

Embodiments of the present disclosure provide a terminal including the compatible circuit.

The compatible circuit includes: a printed circuit hoard PCB with an unchanged existing structure, and a group of compatible devices which are in a Pin-to-Pin form and have different internal structures, wherein the compatible devices and the PCB are assembled together. The internal structures of the compatible devices are matched with a link compatibility selection requirement; and the compatible devices are configured to conduct link selection output on at least two links which are inputted and need compatibility according to the link compatibility selection requirement.

In a preferred implementation manner of the embodiments of the present disclosure, the compatible circuit is the compatible circuit according to any one of the foregoing solutions.

It is apparent that the embodiments of the present disclosure achieve the purpose of link selection compatibility through designing a group of Pin-to-Pin compatible devices with different internal structures. The embodiments of the present disclosure are explained specifically with reference to examples under a plurality of scenes.

First scene: a scene of circuit compatibility selection for two links, i.e., a one-from-two scene.

Figure 2:
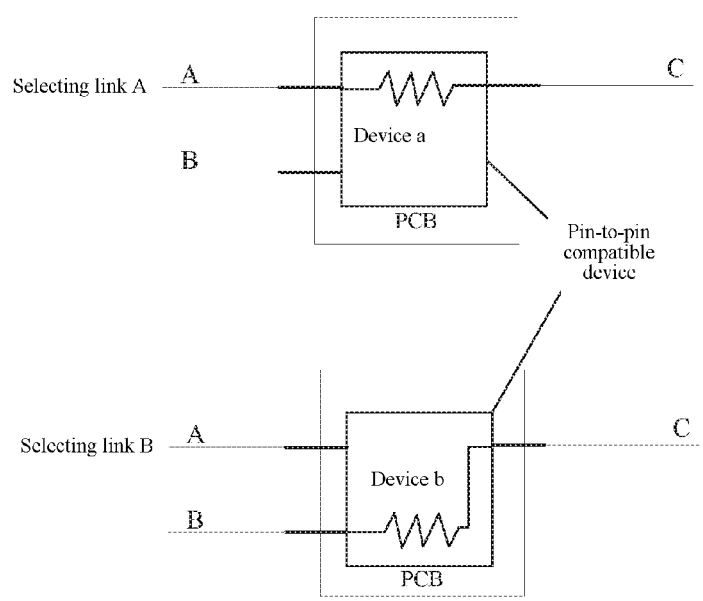
FIG. 2 is a block diagram for selecting inputs and outputs of compatible circuits by using compatible devices, according to the embodiments of the present disclosure.

FIG. 2 shows two Pin-to-Pin compatible devices a and b with different internal structures designed according to the embodiments of the present disclosure, wherein the internal structures thereof are as shown in FIG. 2. FIG. 2 shows compatible devices that conduct circuit compatibility selection on two links, wherein the inside of the compatible device may either be packed with resistors according to demands (as shown FIG. 2), or packed with capacitors, inductors or straight-through wires according to demands. Link C is designed to be a public link, and links A and B are designed to be links that require compatibility. When the compatible device a is mounted on the PCB, then link A is selected; and when the compatible device b is mounted on the PCB, then link B is selected, so that an effect of being compatible with two frequency bands (or links) is achieved, and no redundant connection is generated.

Second scene: a scene of N-link (any quantity of links) compatibility selection, i.e., a one-from-multiple scene, wherein N is a natural number greater than 1.

Figure 3:
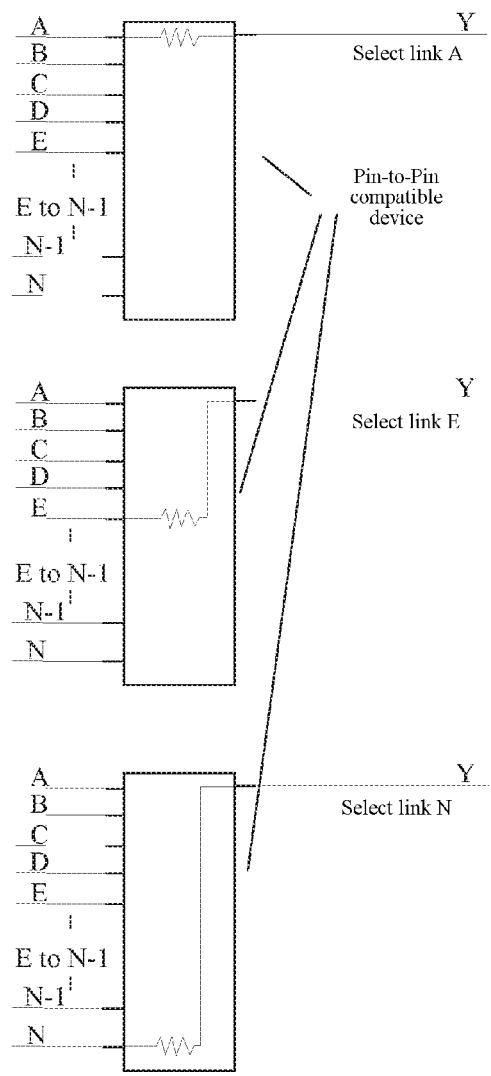
FIG. 3 is a block diagram of selecting inputs and outputs of N link compatible circuits by using Pin-to-pin compatible devices, according to the embodiments of the present disclosure.

FIG. 3 shows N Pin-to-Pin compatible devices 1 to N with different internal structures designed according to the embodiments of the present disclosure, wherein the internal structures thereof are as shown in FIG. 3, including N pin-to-pin compatible devices with different internal connections, wherein the inside of the compatible device may either be packed with resistors (as shown in FIG. 3) according to requirements or packed with capacitors, inductors or straight-through wires according to requirements. Link Y is designed to be a public link, and links A to N are designed to be links that require compatibility. Selecting corresponding devices according to requirements can achieve to select one from N of the links, i.e., link A is selected when the compatible device 1 is mounted link B is selected when the device 2 is mounted and similarly, link E is selected when the device e (1<=e<=N) is mounted; until link N is selected when the device N is mounted. In this way, a purpose of being compatible with N links is achieved.

Third scene: a scene of circuit compatibility selection for five links, which is different from the above first scene and second scene in that two links, rather than one link, are outputted, i.e., a two-from-five scene.

Figure 4A:
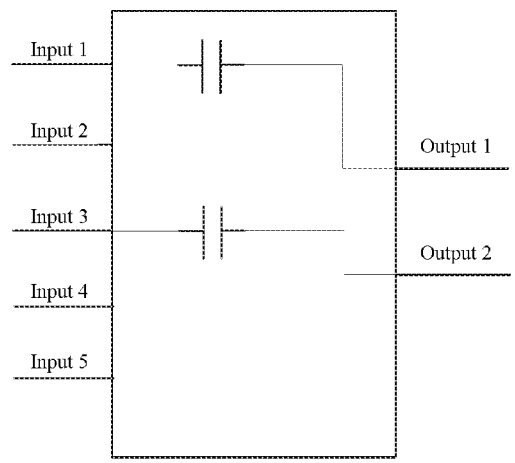
FIGS. 4a-4b are block diagrams for selecting an input and an output of a circuit by using the compatible devices, according to the embodiments of the present disclosure.
Figure 4B:
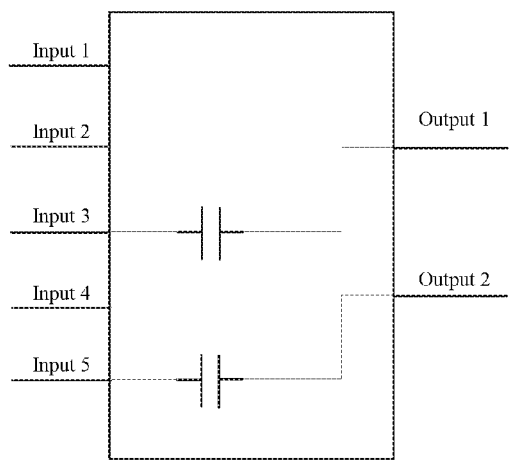

It should be noted that in addition to the compatible devices under the above-mentioned one-from-N (one-from-multiple) scene, there may be compatible devices under an M-from-N (multiple from multiple) scene. That is, the compatible devices according to the embodiments of the present disclosure may also be expanded to a multiple-from-multiple scene. For example, FIG. 4a to FIG. 4b show two examples of the two-from-five scene. FIGS. 4a-4b show the two-from-five scene illustrated by the embodiments of the present disclosure (two-from-five scene includes 20 cases), and among them, two cases are taken as examples for explanation only herein.

It is possible to design 20 pin-to-pin compatible devices with different internal structures. FIGS. 4a-4b show two compatible devices, wherein according to requirements, the inside of the compatible device may be packed with capacitors (as shown in FIGS. 4a-4b), or packed with resistors, inductors or straight-through wires. When the first compatible device in FIGS. 4a-4b is selected, then Input 1 is connected to Output 1, and Input 3 is connected to Output 2; When the second compatible device is selected, then Input 3 is connected to Output 1, and Input 5 is connected to Output 2. In a similar manner, an object of freely connecting five input ends to two output ends can be achieved by selecting 20 different devices, thus completing two-from-five link compatibility selection.

Figure 5:
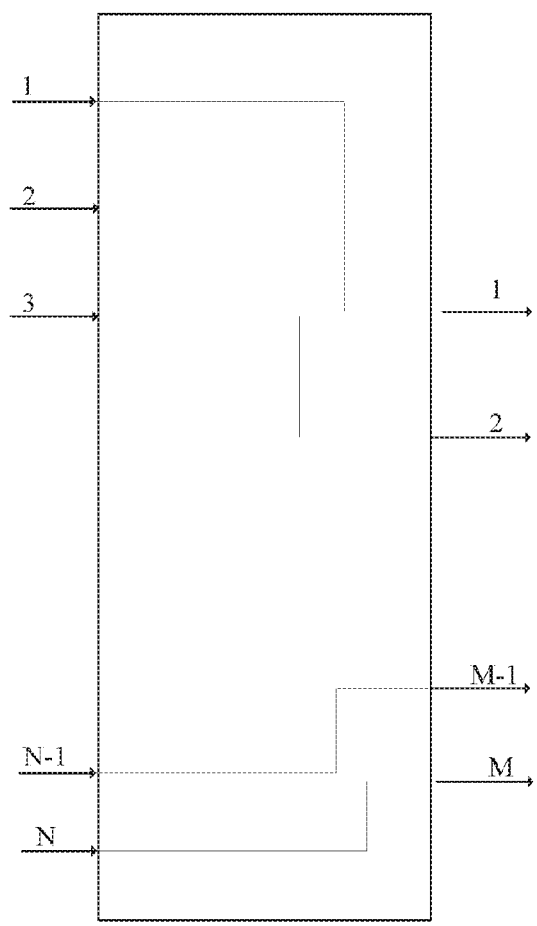
FIG. 5 is a block diagram for selecting an input and an output of a circuit by using the compatible devices, according to the embodiments of the present disclosure.

Similarly, FIG. 5 shows a block diagram of an M-from-N scene, wherein N is a natural number greater than 1, and NI is a natural number greater than or equal to 1. N*M pin-to-pin devices may be designed to complete a compatible situation of freely connecting N inputs to M outputs.

Fourth scene: a link compatibility scene of one-from-four compatible devices in the field of radio frequency technologies.

Figure 6:
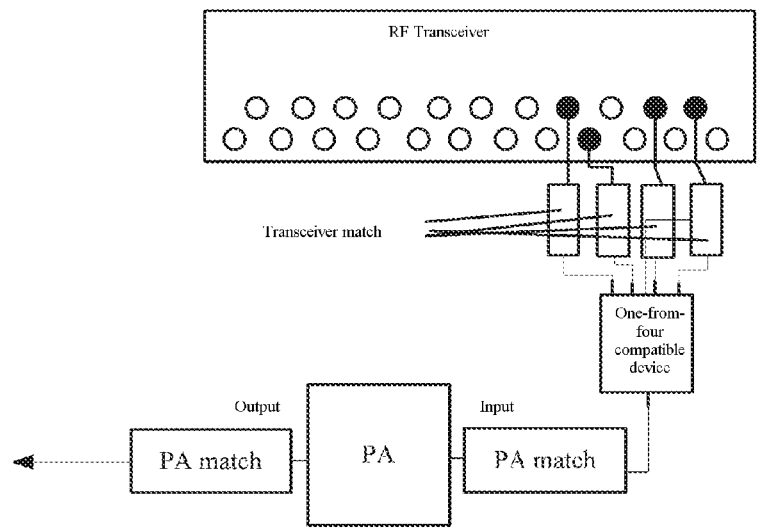
FIG. 6 is a block diagram of a compatible design for four TX links by using a one-from-four device, according to the embodiments of the present disclosure.

FIG. 6 is an example of the embodiments of the present disclosure that complete the compatibility of four transmitting links through selecting one pin-to-pin device from a group of four pin-to-pin devices, wherein the compatibility of four links can be completed only through selecting one of the four pin-to-pin devices, and one TX transmitting link is shared. The PA module in FIG. 6 refers to a power amplifier, the full name of which is a Power Amplifier, and a PA match module is a match circuit of the power amplifier. The solution may be generalized to a one-from-multiple solution in any situations.

Fifth scene: a scene of applying compatible devices and packing other devices excluding resistors and capacitors, or the like, inside the compatible devices, wherein this scene includes two situations of packing a differential duplexer and a single-ended duplexer.

Figure 7A:
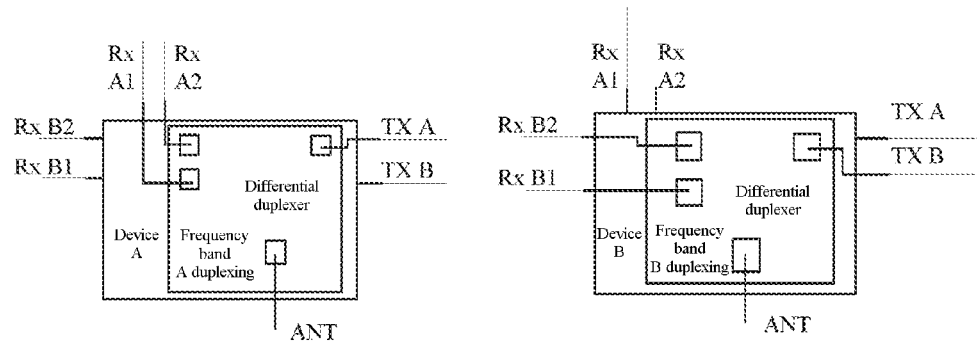
FIGS. 7a-7b are block diagrams of a compatible design of packing differential or single-ended duplexers inside the compatible devices, according to the embodiments of the present disclosure.

FIG. 7a shows a structure and a design solution of the differential duplexer, wherein two differential duplexers are Pin-to-Pin, and meanwhile, a compatible device A supports frequency band A, and a compatible device B supports frequency band B. The insides of the compatible devices A and B are integrated with the differential duplexer, wherein A and B are packed in the same way, but have different internal connecting relationships, and the frequency bands of the integrated duplexers are also different. Rx A1 and Rx A2 are receiving differential links of frequency band A, and TX A is a transmitting link of frequency band A; Rx B1 and Rx B2 are receiving differential links of frequency band B, and TX B is a transmitting link of frequency band B; and ANT is a public end. When the compatible device A is selected, link (frequency band) A is selected, and link (frequency band) A works by using the compatible device A; and similarly, when the compatible device B is selected, link B is selected, and link B works by using the compatible device B.

Figure 7B:
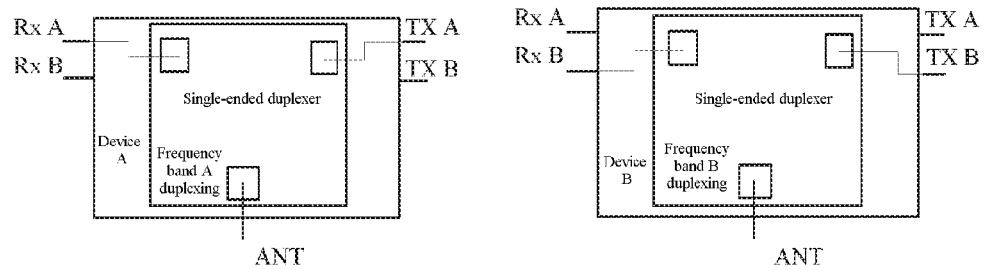

FIG. 7b shows a structure and a design solution of the single-ended duplexer, wherein a compatible device A supports frequency band A, and a compatible device B supports frequency band B. The insides of the compatible devices A and B are integrated with the single-ended duplexer, wherein A and B are packed in the same way, but have different internal connecting relationships, and the frequency bands of the integrated duplexers are also different. Rx A is a receiving link of frequency band A, and TX A is a transmitting link of frequency band A; Rx B is a receiving link of frequency band B, and TX B is a transmitting link of frequency band B; and ANT is a public end. When the compatible device A is selected, link (frequency band) A is selected, and link (frequency band) A works by using the compatible device A; and similarly, when the compatible device B is selected, link B is selected, and link B works by using the compatible device B.

Both the compatible devices as shown in FIG. 7a or FIG. 7b can be compatible with two links (frequency bands).

Sixth scene: a scene of applying compatible devices and packing other devices excluding resistors and capacitors, or the like, inside the compatible devices, wherein this scene includes two situations of packing a differential filter and a single-ended filter at different frequency bands.

Figure 8A:
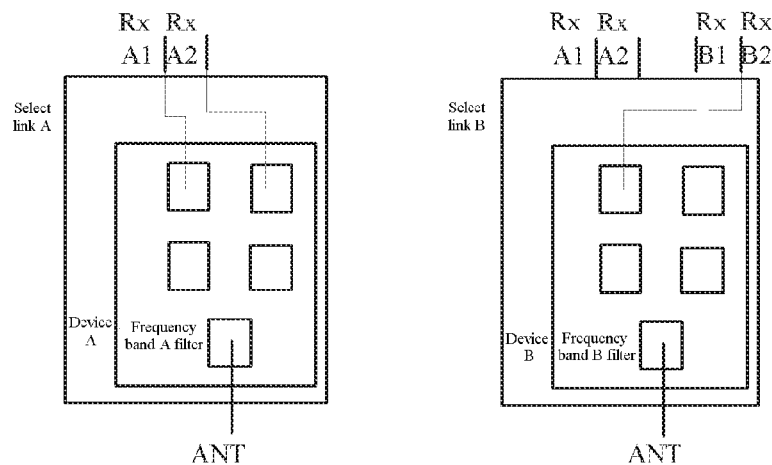
FIGS. 8a-8b are block diagrams of a compatible design of packing differential or single-ended filters inside the compatible devices, according to the embodiments of the present disclosure.
Figure 8B:
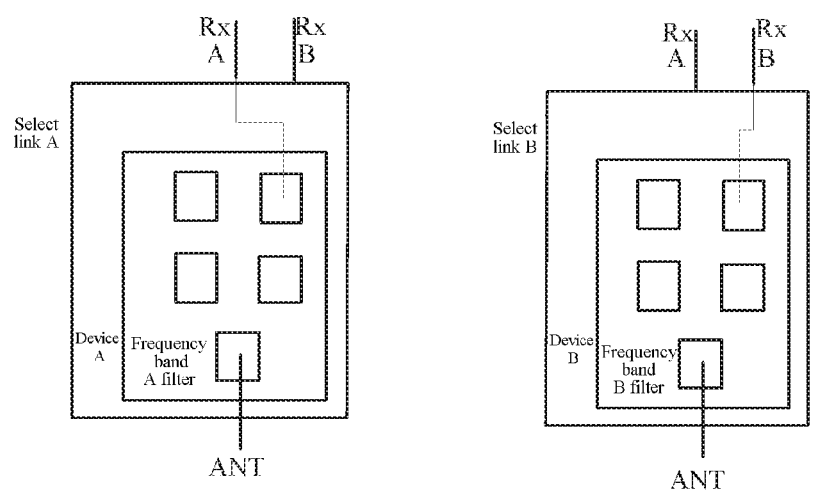

FIGS. 8a-8b illustrate the embodiments of the present disclosure that propose to pack the differential filters and single-ended filters into the compatible devices. FIG. 8a shows a structure and a design solution of the differential filter, wherein two differential filters are Pin-to-Pin, but a compatible device A supports frequency band A, and a compatible device supports frequency band B. Rx A1 and Rx A2 are receiving differential links of frequency band A; Rx B1 and Rx B2 are receiving differential links of frequency band B; and ANT is a public end. When the compatible device A is used, frequency band A is linked to work, and when the compatible device B is used, frequency band B is linked to work, so that an object of being compatible with two frequency bands is achieved.

FIG. 8b shows a structure and a design solution of the single-ended filter, wherein two differential filters are Pin-to-Pin, but a compatible device A supports frequency band A, and a compatible device supports frequency band B. Rx A is a receiving link of frequency band A; Rx B is a receiving link of frequency band B; and ANT is a public end. When the compatible device A is used, frequency hand A is linked to work, and when the compatible device B is used, frequency band B is linked to work, so that an object of being compatible with two frequency hands is achieved.

Both the compatible devices as shown in FIG. 8a or FIG. 8b can be compatible with two links (frequency bands).

It should be noted that the structure and design solution of the differential filter as shown in FIG. 8a as well as the structure and design solution of the single-ended filter as shown in FIG. 8b are similarly suitable for a TX transmitting filter. All these figures are schematic diagrams, and specific device packing may be changed, while any changes within the spirit and principle of the present disclosure shall all fall within protection scope of the present disclosure.

In conclusion, when adopting the embodiments of the present disclosure, a compatible effect can be achieved by only replacing a group of Pin-to-Pin compatible devices at the front segment or rear segment of the public link while designing the PCB, which can reduce redundant lines produced by the existing compatible solution, and avoid Pin-on-Pin design; the compatible effect can be achieved by replacing the compatible devices; and more links (frequency bands) can be compatible.

Moreover, the embodiments of the present disclosure also propose a concept of packing a compatible link in such devices like a filter, a duplexer, a power amplifier, etc., so that redundant compatible devices can be omitted, and a layout space of the PCB occupied by the device is further reduced.

Moreover, the present disclosure may also be generalized to design of all compatible circuits excluding radio frequency, to play a role of being compatible with two or more links and frequency bands in a space as small as possible, and increasing the compatibility of circuit design while reducing the space of the PCB occupied by the devices and circuits.

If the integrated module according to the embodiments of the present disclosure is implemented in the form of a software function module and is sold or used as an independent product, it may be stored in a computer-readable storage medium. Based on such understanding, the essential part or the part contributing to the prior art of the technical solution of the embodiments of the present disclosure may be implemented in the form of a software product. The computer software product is stored in a storage medium, and includes several instructions for instructing a computer device (which may be a personal computer, a server, a network device, or the like) to execute all or a part of the method according to individual embodiments of the present disclosure. The aforementioned storage medium includes: any medium that is capable of storing program codes, such as a USB disk, a mobile hard disk, a read-only memory (ROM), a random access memory (RAM), a magnetic disk, or an optical disk. In this way, the embodiments of the present disclosure are not restricted to any particular combination of hardware and software.

The above is merely preferred embodiments of the present disclosure, but is not intended to limit the protection scope of the present disclosure.

INDUSTRIAL APPLICABILITY

The compatible circuit according to the embodiments of the present disclosure includes: the printed circuit board PCB with an unchanged existing structure, and a group of compatible devices which are in a Pin-to-Pin form and have different internal structures, wherein the compatible devices and the PCB are assembled together; the internal structures of the compatible devices are matched with a link compatibility selection requirement; and the compatible devices are configured to conduct a link selection output on at least two links which are inputted and need compatibility according to the link compatibility selection requirement. Because the link selection output complied with the link compatibility selection requirement is implemented through the compatible devices without changing the PCB, the embodiments of the present disclosure have compatibility, so that all the terminal parts are unnecessary to be designed on one PCB, and an additional cost will not be increased.

What is claimed is:

1. A compatible circuit, comprising:
a printed circuit board PCB with an unchanged existing structure, and one group of compatible devices which are in a Pin-to-Pin form and have different internal structures, wherein the compatible devices and the PCB are assembled together;
the internal structures of the compatible devices are matched with a link compatibility selection requirement; and
the compatible devices are configured to conduct a link selection output on at least two links which are inputted and need compatibility according to the link compatibility selection requirement,
wherein there are two links which are inputted and need compatibility, and the two links are a first link and a second link respectively;
accordingly, one group of compatible devices comprises two compatible devices, which are a first compatible device and a second compatible device respectively, wherein:
the first compatible device is configured to connect the inputted first link to a first output end to output, and select the first link to be under a working state when the first compatible device and the PCB are assembled together; and
the second compatible device is configured to connect the inputted second link to the first output end to output, and select the second link to the under a working state when the second compatible device and the PCB are assembled together.

2. A compatible circuit, comprising:
a printed circuit board PCB with an unchanged existing structure, and one group of compatible devices which are in a Pin-to-Pin form and have different internal structures, wherein the compatible devices and the PCB are assembled together;
the internal structures of the compatible devices are matched with a link compatibility selection requirement; and
the compatible devices are configured to conduct a link selection output on at least two links which are inputted and need compatibility according to the link compatibility selection requirement,
wherein there are more than two links which are inputted and need compatibility, and the more than two links are a first link to an $N^{th}$ link respectively; and N is a natural number greater than 2;
accordingly, one group of compatible devices comprises more than two compatible devices, which are a first compatible device to an $N^{th}$ compatible device; wherein:
the first compatible device is configured to connect the inputted first link to a first output end to output, and select the first link to be under a working state when the first compatible device and the PCB are assembled together; and
so on, until the $N^{th}$ compatible device is configured to connect the inputted $N^{th}$ link to the first output end to output, and select the $N^{th}$ link to be under a working state when the $N^{th}$ compatible device and the PCB are assembled together.

3. A compatible circuit, comprising:
a printed circuit board PCB with an unchanged existing structure, and one group of compatible devices which are in a Pin-to-Pin form and have different internal structures, wherein the compatible devices and the PCB are assembled together;
the internal structures of the compatible devices are matched with a link compatibility selection requirement; and
the compatible devices are configured to conduct a link selection output on at least two links which are inputted and need compatibility according to the link compatibility selection requirement,
wherein there are N links which are inputted and need compatibility, and the N links are a first link to an $N^{th}$ link respectively; N is a natural number greater than or equal to 2;
accordingly, one group of compatible devices comprises N compatible devices, which are a first compatible device to an $N^{th}$ compatible device respectively; there are M output ends, and M is a natural number greater than or equal to 2, wherein:
the first compatible device is configured to connect at least one link of the inputted first link to the $N^{th}$ link to a first output end to output, and select the at least one link of the inputted first link to the $N^{th}$ link which is connected to the first output end to be under a working state when the first compatible device and the PCB are assembled together;
the $N^{th}$ compatible device is configured to connect at least one link of the inputted first link to the $N^{th}$ link to at least one output end of the first output end to the $M^{th}$ output end to output, and select the at least one link of the inputted first link to the $N^{th}$ link which is connected with the at least one output end to be under a working state when the $N^{th}$ compatible device and the PCB are assembled together; and
so on, until a compatibility selection of any connection between N inputs and M outputs are completed through the first compatible device to the $N^{th}$ compatible device.

4. The compatible circuit according to claim 3, wherein the output end is configured to connect to a public link, and the compatible devices are located at a front segment or a rear segment of the public link.

5. The compatible circuit according to claim 1, wherein the internal structures of the compatible devices are formed by at least one manner of series resistors, capacitors, inductors and straight-through wires according to the link compatibility selection requirement.

6. The compatible circuit according to claim 1, wherein the compatible devices are also internally packed with at least one device of a differential duplexer, a single-ended duplexer, a differential filter and a single-ended filter.

7. The compatible circuit according to claim 1, wherein the compatible devices and the PCB are assembled together in a mounting manner.

8. A terminal, comprising a compatible circuit, wherein:
the compatible circuit comprises: a printed circuit board PCB with an unchanged existing structure, and a group of compatible devices which are in a Pin-to-Pin form and have different internal structures,
the compatible devices and the PCB are assembled together;
the internal structures of the compatible devices are matched with a link compatibility selection requirement; and
the compatible devices are configured to conduct a link selection output on at least two links which are inputted and need compatibility according to the link compatibility selection requirement,
wherein there are two links which are inputted and need compatibility, and the two links are a first link and a second link respectively;
accordingly, one group of compatible devices comprises two compatible devices, which are a first compatible device and a second compatible device respectively, wherein:
the first compatible device is configured to connect the inputted first link to a first output end to output, and select the first link to be under a working state when the first compatible device and the PCB are assembled together; and
the second compatible device is configured to connect the inputted second link to the first output end to output, and select the second link to be under a working state when the second compatible device and the PCB are assembled together.

9. A terminal, comprising a compatible circuit, wherein:
the compatible circuit comprises: a printed circuit board PCB with an unchanged existing structure, and a group of compatible devices which are in a Pin-to-Pin form and have different internal structures,
the compatible devices and the PCB are assembled together;
the internal structures of the compatible devices are matched with a link compatibility selection requirement; and
the compatible devices are configured to conduct a link selection output on at least two links which are inputted and need compatibility according to the link compatibility selection requirement, wherein there are more than two links which are inputted and need compatibility, and the more than two links are a first link to an $N^{th}$ link respectively; and N is a natural number greater than 2;

accordingly, one group of compatible devices comprises more than two compatible devices, which are a first compatible device to an $N^{th}$ compatible device; wherein:

the first compatible device is configured to connect the inputted first link to a first output end to output, and select the first link to be under a working state when the first compatible device and the PCB are assembled together; and so on, until the $N^{th}$ compatible device is configured to connect the inputted $N^{th}$ link to the first output end to output, and select the $N^{th}$ link to the under a working state when the $N^{m}$ compatible device and the PCB are assembled together.

10. A terminal, comprising a compatible circuit, wherein:

the compatible circuit comprises: a printed circuit board PCB with an unchanged existing structure, and a group of compatible devices which are in a Pin-to-Pin form and have different internal structures, the compatible devices and the PCB are assembled together:

the internal structures of the compatible devices are matched with a link compatibility selection requirement; and the compatible devices are configured to conduct a link selection output on at least two links which are inputted and need compatibility according to the link compatibility selection requirement, wherein there are N links which are inputted and need compatibility, and the N links are a first link to an $N^{th}$ link respectively; N is a natural number greater than or equal to 2;

accordingly, one group of compatible devices comprises N compatible devices, which are a first compatible device to an $N^{th}$ compatible device respectively; there are M output ends, and M is a natural number greater than or equal to 2, wherein:

the first compatible device is configured to connect at least one link of the inputted first link to the $N^{th}$ link to a first output end to output, and select the at least one link of the inputted first link to the $N^{th}$ link Which is connected to the first output end to the under a working state when the first compatible device and the PCB are assembled together;

the $N^{th}$ compatible device is configured to connect at least one link of the inputted first link to the $N^{th}$ link to at least one output end of the first output end to the $M^{th}$ output end to output, and select the at least one link of the inputted first link to the $N^{th}$ link which is connected with the at least one output end to be under a working state when the $N^{th}$ compatible device and the PCB are assembled together; and so on, until a compatibility selection of any connection between N inputs and M outputs are completed through the first compatible device to the $N^{th}$ compatible device.

11. The terminal according to claim 10, wherein the output end is configured to connect to a public link, and the compatible devices are located at a front segment or a rear segment of the public link.

12. The terminal according to claim 8, wherein the internal structures of the compatible devices are formed by at least one manner of series resistors, capacitors, inductors and straight-through wires according to the link compatibility selection requirement.

13. The terminal according to claim 8, wherein the compatible devices are also internally packed with at least one device of a differential duplexer, a single-ended duplexer, a differential filter and a single-ended filter.

14. The terminal according to claim 8, wherein the compatible devices and the PCB are assembled together in a mounting manner.

15. The compatible circuit according to claim 2, wherein the internal structures of the compatible devices are formed by at least one manner of series resistors, capacitors, inductors and straight-through wires according to the link compatibility selection requirement.

16. The compatible circuit according to claim 2, wherein the compatible devices are also internally packed with at least one device of a differential duplexer, a single-ended duplexer, a differential filter and a single-ended filter.

17. The compatible circuit according to claim 2, wherein the compatible devices and the PCB are assembled together in a mounting manner.

18. The compatible circuit according to claim 3, wherein the internal structures of the compatible devices are formed by at least one manner of series resistors, capacitors, inductors and straight-through wires according to the link compatibility selection requirement.

19. The compatible circuit according to claim 3, wherein the compatible devices are also internally packed with at least one device of a differential duplexer, a single-ended duplexer, a differential filter and a single-ended filter.

20. The compatible circuit according to claim 3, wherein the compatible devices and the PCB are assembled together in a mounting manner.

* * * * *